United States Patent [19]

Kirlin et al.

[11] Patent Number: 5,711,816
[45] Date of Patent: *Jan. 27, 1998

[54] SOURCE REAGENT LIQUID DELIVERY APPARATUS, AND CHEMICAL VAPOR DEPOSITION SYSTEM COMPRISING SAME

[75] Inventors: Peter S. Kirlin, Bethel; Robin L. Binder, Bethlehem; Robin A. Gardiner, Bethel; Peter Van Buskirk, Newtown; Gregory Stauf, New Milford, all of Conn.; Jiming Zhang, Cupertino, Calif.

[73] Assignee: Advanced Technolgy Materials, Inc., Danbury, Conn.

[*] Notice: The term of this patent shall not extend beyond the expiration date of Pat. No. 5,536,323.

[21] Appl. No.: 484,025

[22] Filed: Jun. 7, 1995

Related U.S. Application Data

[63] Continuation-in-part of PCT/US94/02512 Mar. 7, 1994 and a continuation-in-part of Ser. No. 280,143, Jul. 28, 1994, Pat. No. 5,536,323, which is a continuation of Ser. No. 927,134, Aug. 7, 1992, which is a continuation-in-part of Ser. No. 807,807, Dec. 13, 1991, Pat. No. 5,204,314, which is a continuation of Ser. No. 549,389, Jul. 6, 1990, abandoned.

[51] Int. Cl.$^6$ ..................................................... C23C 16/00
[52] U.S. Cl. .......................... 118/726; 261/154; 261/100; 261/104; 261/106; 261/107; 261/DIG. 65; 392/399
[58] Field of Search ......................... 118/715, 726; 392/395, 399; 261/1.54, 100, 104, 106, 107, DIG. 65

[56] References Cited

U.S. PATENT DOCUMENTS

| | | | |
|---|---|---|---|
| 476,274 | 6/1892 | Huck | 261/147 |
| 2,490,547 | 12/1949 | Schraner et al. | 219/39 |
| 2,622,184 | 12/1952 | Johneas | 219/38 |
| 2,801,322 | 7/1957 | Wetherill | 219/39 |
| 2,925,329 | 2/1960 | Yost | 422/199 |
| 3,190,262 | 6/1965 | Bakish et al. | 118/48 |
| 3,404,873 | 10/1968 | Orens | 261/141 |

(List continued on next page.)

FOREIGN PATENT DOCUMENTS

| | | |
|---|---|---|
| 0 058 571 | 8/1982 | European Pat. Off. . |
| 0 328 333 | 8/1989 | European Pat. Off. . |
| 0 405 634 A2 | 1/1991 | European Pat. Off. . |
| 370473 | 3/1923 | Germany . |
| 58-125633 | 7/1983 | Japan . |
| 1305813 | 12/1989 | Japan . |
| WO93/04072 | 3/1993 | WIPO . |

OTHER PUBLICATIONS

"Integrated Systems Approach Based on DLI." Bulletin LPDS–Dec. 1994, copyright 1994, MKS Instruments, Inc.

(List continued on next page.)

Primary Examiner—Robert Kunemund
Assistant Examiner—Jeffrie R. Lund
Attorney, Agent, or Firm—Janet R. Elliot; Steven J. Hultquist

[57] ABSTRACT

A process and apparatus for delivering an involatile reagent in gaseous form, wherein an involatile reagent source liquid is flash vaporized on a vaporization matrix structure at elevated temperature. A carrier gas may be flowed past the flash vaporization matrix structure to yield a carrier gas mixture containing the flash vaporized source reagent. The matrix structure preferably has a high surface-to-volume ratio, and may suitably comprise a foraminous matrix element such as screen mesh onto which the reagent source liquid is distributed for flash vaporization. The invention is particularly useful for delivery of Group II reagents and compounds and complexes of early transition metals such as zirconium and hafnium, and may be usefully employed with Group II beta-diketonate source layers, e.g., of YBaCuO, BiSrCaCuO, and TlBaCaCuO types, as well as for forming interlayers of Group II metal fluorides between superconductor or gallium arsenide overlayers, and for depositing thin films of photonic and ferroelectric materials, e.g., $BaTiO_3$, $Ba_xSr_{1-x}Nb_2O_6$, and $PbZr_{1-x}Ti_xO_3$.

20 Claims, 8 Drawing Sheets

U.S. PATENT DOCUMENTS

| | | | |
|---|---|---|---|
| 3,520,416 | 7/1970 | Keedwell | 210/490 |
| 3,549,413 | 12/1970 | Frey Jr. et al. | 117/100 |
| 3,659,402 | 5/1972 | Alliger | 55/233 |
| 3,823,926 | 7/1974 | Bracich | 261/106 |
| 3,969,449 | 7/1976 | Shires et al. | 261/153 |
| 4,020,321 | 4/1977 | Oswald | 219/271 |
| 4,036,915 | 7/1977 | Lucero et al. | 261/104 |
| 4,080,926 | 3/1978 | Platakis et al. | 118/5 |
| 4,288,396 | 9/1981 | Ottestad | 261/128 |
| 4,529,427 | 7/1985 | French | 65/3.12 |
| 4,748,314 | 5/1988 | Desage | 219/274 |
| 4,833,876 | 5/1989 | Loland | 92/86.5 |
| 4,842,893 | 6/1989 | Yializis et al. | 427/44 |
| 4,847,469 | 7/1989 | Hofmann et al. | 219/273 |
| 4,954,371 | 9/1990 | Yializis | 427/44 |
| 5,034,372 | 7/1991 | Matsuno et al. | 505/1 |
| 5,097,800 | 3/1992 | Shaw et al. | 118/730 |
| 5,110,622 | 5/1992 | Hasegawa et al. | 427/126.1 |
| 5,120,703 | 6/1992 | Snyder et al. | 505/1 |
| 5,139,999 | 8/1992 | Gordon et al. | 505/1 |
| 5,165,960 | 11/1992 | Platts | 427/166 |
| 5,204,314 | 4/1993 | Kirlin et al. | 505/1 |
| 5,225,561 | 7/1993 | Kirlin et al. | 546/256 |
| 5,248,787 | 9/1993 | Timmer et al. | 549/206 |
| 5,259,995 | 11/1993 | Matalis | 261/107 |
| 5,280,012 | 1/1994 | Kirlin et al. | 505/1 |
| 5,376,409 | 12/1994 | Kaloyeros et al. | 427/248.1 |
| 5,536,323 | 7/1996 | Kirlin et al. | 118/716 |

OTHER PUBLICATIONS

"Direct Liquid Injection Sub–System—DLI–25B," Bulletin DLI–Dec. 1994, copyright 1994, MKS Instruments, Inc.

Singh, R.K., et al., "In situ processing of epitaxial Y–Ba–Cu–O highTc superconducting films on (100) SiTiO$_3$ and (100) YS–ZrO$_2$ substrates at 500–650°C, " App. Phys. Lett. 54(22), 29 May 1989, pp. 2271–2273.

Yoshitake, T., et al., "As–grown superconducting Bi–Sr–Ca–Cu–O thin films by coevaparation," App. Phys. Lett. 55(7), 14 Aug. 1989, pp. 702–704.

Erbil, A., et al., "A Review of Metalorganic Chemical Vapor Deposition of High–Temperature Superconducting Thin Films," SPIE vol. 1187 Processing of Films for High Tc Superconducting Electrinocs (1989), 104–109.

Kirlin, Peter S., et al., "Growth of highTc YBCuO thin films by metalorganic chemical vapor deposition," SPIE vol. 1187 Processing of Films for HIgh Tc Superconducting Electronics (1989), 115–127.

Zama, H., et al., "Properties of Metalorganic Precursors for Chemical Vapor Deposition of Oxide Superconductors," Japanese Journal of Applied Physics, 29(7), Jul. 1990, pp. L1072–L1074.

Gardiner, R., "Volatile Barium β–Diketonate Polyether Adducts, Synthesis, Characterization, and Metallorganic Chemical Vapor Deposition," Chem. Mater., 3(6), 1991, pp. 1053–1059.

Lackey, W.J., et al., "Rapid chemical vapor depostion of superconducting YBa$_2$Cu$_3$O$_x$," Appl. Phys. Lett. 56(12), 19 Mar. 1990, pp. 1175–1177.

Turnipseed, S.B., et al., "Synthesis and Characterization of Alkaline–Earth–Metal β–Diketonate Complexes Used as Precursors for Chemical Vapor Depostion of Thin–Film Superconductors," Inorg. Chem. 1991, 30(6), 1164–1170.

Hiskes, R., "Single source metalorganic chemical vaopr deposition fo low microwave surface resistance YBa$_2$Cu$_7$," Appl. Phys. Lett. 59(5), 29 Jul. 1991, pp. 606–607.

Zhang, J., et al., "Plasma Enhanced Metalorganic Chemical Vapor Deposition of Conductive Oxide Electrodes for Ferroelectric BaTiO$_3$ Capacitors," Mat. Res. Soc. Symp. Proc., vol. 310, 1993, pp. 249–254.

Van Buskirk, P., et al., "MOCVD Growth of BiTiO$_3$ in an 8" Single–Wafer CVD Reactor," Proceedings of ISAF92, in press (1992), 3 pages.

Zhang, J., et al., "Single liquid source plasma–enhanced metalorganic chemical vaopr deposition of high–quality YBa$_2$Cu$_3$O$_{7-x}$ thin films," Appl. Phys. Lett. 61(24), 14 Dec. 1992, pp. 2884–2886.

Panson,A.J., et al., "Chemical vapor deposition of YBa$_2$Cu$_3$O$_7$ using metalorganic chelate precursors," Appl. Phys. Lett. 53(18), 31 Oct. 1988, pp. 1756–1757.

Scarsbrook, G., et al., "Low temperature pulsed plasma depostion, Part I–a new technique for thin film dposition with complete gas dissociation," Vacuum, 38(8–10), 1988, pp. 627–631.

SOURCE REAGENT LIQUID DELIVERY APPARATUS, AND CHEMICAL VAPOR DEPOSITION SYSTEM COMPRISING SAME

CROSS-REFERENCE TO RELATED APPLICATIONS

This is a continuation-in-part of International Patent Application No. PCT/US94/02512 filed Mar. 7, 1994 and designating therein the United States as a Designated State. This also is a continuation-in-part of U.S. application Ser. No. 08/280,143 filed Jul. 25, 1994, now U.S. Pat. No. 5,536,323, which is a file wrapper continuation of U.S. application Ser. No. 08/927,134 filed Aug. 7, 1992, which is a continuation-in-part of U.S. application Ser. No. 07/807,807 filed Dec. 13, 1991, now issued as U.S. Pat. No. 5,204,314, which is a continuation of U.S. application Ser. No. 07/549,389 filed Jul. 6, 1990, now abandoned.

GOVERNMENT RIGHTS IN INVENTION

This invention was made with Government support under Contract No. N00014-88-C-0531 awarded by the Defense Advanced Projects Research Agency (DARPA). The Government has certain rights in this invention.

BACKGROUND OF THE INVENTION

1. Field of the Invention

This invention relates to a vaporizer apparatus for volatilizing and delivering chemical vapor deposition liquid source reagents to a chemical vapor deposition (CVD) reactor, wherein the reactor is coupled in gas flow communication relationship with such vaporizer apparatus, and with the volatilized source reagent including at least one vapor phase component which is deposited on a substrate upon decomposition of the reagent in the reactor.

2. Description of the Related Art

Many materials are utilized in the form of thin films on substrates and are formed by vapor deposition techniques. Examples include refractory materials such as high temperature superconducting (HTSC) materials including $YBa_2Cu_3O_x$, wherein x is from about 6 to 7.3, BiSrCaCuO, and TlBaCaCuO. Barium titanate, $BaTiO_3$, and barium strontium titanate, $Ba_xSr_{1-x}TiO_3$, have been identified as ferroelectric and photonic materials with unique and potentially very useful properties in thin film applications of such materials. $Ba_xSr_{1-x}Nb_2O_6$ is a photonic material whose index of refraction changes as a function of electric field and also as a function of the intensity of light upon it. Lead zirconate titanate, $PbZr_{1-x}Ti_xO_3$, is a ferroelectric material whose properties are very interesting. The Group II metal fluorides, $BaF_2$, $CaF_2$, and $SrF_2$, are useful for scintillation detecting and coating of optical fibers. Refractory oxides such as $Ta_2O_5$ are coming into expanded use in the microelectronics industry; $Ta_2O_5$ is envisioned as a thin-film capacitor material whose use may enable higher density memory devices to be fabricated.

Many of the potential applications of these materials require their use in thin film, coating, or layer form. The films or layers may also be advantageously epitaxially related to the substrate upon which they are formed. Applications in which the refractory materials may need to be deposited in film or layer form include integrated circuits, switches, radiation detectors, thin film capacitors, holographic storage media, and various other microelectronic devices.

Chemical vapor deposition (CVD) is a particularly attractive method for forming these layers because it is readily scaled up to production runs and because the electronic industry has a wide experience and an established equipment base in the use of CVD technology which can be applied to new CVD processes. In general, the control of key variables such as stoichiometry and film thickness, and the coating of a wide variety of substrate geometries is possible with CVD. Forming the thin films by CVD will permit the integration of these materials into existing device production technologies. CVD also permits the formation of layers of the refractory materials that are epitaxially related to substrates having close crystal structures.

CVD requires that the element source reagents, i.e., the precursor compounds and complexes containing the elements or components of interest must be sufficiently volatile to permit gas phase transport into the chemical vapor deposition reactor. The elemental component source reagent must decompose in the CVD reactor to deposit only the desired element at the desired growth temperatures. Premature gas phase reactions leading to particulate formation must not occur, nor should the source reagent decompose in the lines before reaching the reactor deposition chamber. When compounds are desired to be deposited, obtaining optimal properties requires close control of stoichiometry which can be achieved if the reagent can be delivered into the reactor in a controllable fashion. In this respect the reagents must not be so chemically stable that they are nonreactive in the deposition chamber.

Desirable CVD reagents therefore are fairly reactive and volatile. Unfortunately, for many of the refractive materials described above, volatile reagents do not exist. Many potentially highly useful refractory materials have in common that one or more of their components are elements, i.e., the Group II metals barium, calcium, or strontium, or the early transition metals zirconium or hafnium, for which no or few volatile compounds well-suited for CVD are known. In many cases, the source reagents are solids whose sublimation temperature may be very close to the decomposition temperature, in which case the reagent may begin to decompose in the lines before reaching the reactor, and it therefore is very difficult to control the stoichiometry of the deposited films from such decomposition-susceptible reagents.

In other cases, the CVD reagents are liquids, but their delivery into the CVD reactor in the vapor phase has proven impractical because of problems of premature decomposition or stoichiometry control.

When the film being deposited by CVD is a multicomponent substance rather than a pure element, such as barium titanate or the oxide superconductors, controlling the stoichiometry of the film is critical to obtaining the desired film properties. In the deposition of such materials, which may form films with a wide range of stoichiometries, the controlled delivery of known proportions of the source reagents into the CVD reactor chamber is essential.

In other cases, the CVD reagents are liquids, but their delivery into the CVD reactor in the vapor phase has proven difficult because of problems of premature decomposition or stoichiometry control. Examples include the deposition of tantalum oxide from the liquid source tantalum ethoxide and the deposition of titanium nitride from bis(dialkylamide) titanium reagents.

While source reagent liquid delivery systems present distinct advantages over conventional techniques, there is often some fraction of the precursor compound that decomposes into very low volatility compounds that remain at the vaporization zone. This deficiency is an important issue in the operation of CVD processes that use thermally unstable solid source precursors which undergo significant decomposition at conditions needed for sublimation. Such decomposition can occur in all reagent delivery systems that involve a vaporization step, including flash vaporizer liquid delivery systems as well as more conventional reagent delivery systems that include bubblers and heated vessels operated without carrier gas.

Although well-behaved CVD precursors vaporized under "ideal" conditions will form no deposits or residue at the vaporization zone, deviations from this situation are common and can be divided into several categories:

1) Reactive impurities in either the precursor or in the carrier gas decompose at the vaporizer temperatures.
2) Spatial and temporal temperature variations occur in the vaporization zone, with temperatures in some regions being sufficient to bring about decomposition.
3) CVD precursors are employed which are thermally unstable at the sublimation temperature.

Optimization of the conditions used in the vaporizer of reagent delivery systems can minimize the fraction of the delivered precursor that decomposes (and remains) at the vaporization zone, but virtually all solid and liquid precursors undergo some decomposition when they are heated for conversion to the gas phase, although this fraction is negligibly small in "well-behaved" compounds. Use of precursors that tend to decompose near their vaporization temperature may be mandated by availability (i.e., where the selected precursor possesses the best properties of available choices) or by economics, where precursor cost is strongly dependent on the complexity of its synthesis.

Additionally, CVD precursors often contain impurities, and the presence of those impurities can cause undesirable thermally activated chemical reactions at the vaporization zone, also resulting in formation of involatile solids and liquids at that location. For example, a variety of CVD precursors (such as tantalum pentaethoxide) are water-sensitive and hydrolysis can occur at the heated vaporizer zone forming tantalum oxide particulates that may be incorporated into the growing tantalum oxide film with deleterious effects.

Despite the advantages of the liquid delivery approach (which include improved precision and accuracy for most liquid and solid CVD precursors and higher delivery rates), the foregoing deficiencies pose a serious impediment to widespread use of the vaporization liquid delivery technique for providing volatilized reagent to the CVD reactor.

Accordingly, it is an object of the present invention to provide an improved liquid delivery system for introduction of CVD source reagent precursors to CVD reactors.

It is another object of the invention to provide an improved liquid source reagent vaporization apparatus for a CVD process system.

Other objects and advantages of the present invention will be more fully apparent from the ensuing disclosure and appended claims.

SUMMARY OF THE INVENTION

In a broad aspect, the present invention relates to a high flux vaporizer for volatilization of a liquid-phase source reagent for chemical vapor deposition in a CVD reactor coupled in vapor flow relationship with the vaporizer.

The vaporizer comprises a flow passage member defining a flow path through which vaporized source reagent, either neat or as augmented by a carrier gas flow through such passage member, flows from a vaporization structure in the flow passage member to the CVD reactor. The CVD reactor is arranged with a substrate disposed therein, typically mounted on a heated susceptor or other support structure, and arranged in receiving relationship to the volatilized source reagent material, so that the vapor is decomposed to deposit one or more selected components, e.g., elemental metals, on the substrate.

The high flux vaporizer structure comprises a porous vaporization element having porosity in the range of from about 0.5 micron to about 200 microns in average pore diameter, preferably from about 1 to about 100 microns in average pore diameter, and with a void volume constituted by such porosity, of from about 10% to about 70%. With such high porosity vaporization element, the source reagent liquid introduced to the surface of such vaporization element is wickingly translated by capillary action through the porous structure, which is in substantially abutting relationship to the flow passage, to provide a vaporization confinement region, in which the source reagent liquid is effectively quickly vaporized in a high flux manner, to generate the volatilized source reagent for transport to the chemical vapor deposition reactor.

By the abutting relationship of the vaporization element to the flow passage member, the vaporization element is heated through the flow passage member, which may in practice comprise a cylindrical tube or conduit wrapped with heating coils or other heat transfer elements or devices, so that the vaporization element in the flow passage member is efficiently heated to suitable elevated temperature to effect the high flux vaporization which is required for close stoichiometric control of the decomposition and deposition process carried out in the CVD reactor located in downstream flow relationship to the vaporizer.

The vaporization element is suitably arranged in the flow passage so that source reagent liquid is directed at a surface of the vaporizer element in a direction generally perpendicular to the impacted surface receiving the source reagent liquid. For example, the liquid may be introduced by a channel or passage member, e.g., a small diameter conduit, which is dead-ended in close proximity to a facing wall surface of the vaporizer element, so that the kinetic energy of the source reagent liquid is converted to lateral spreading motion of the liquid across the vaporizer surface.

The vaporizer element may suitably comprise a pore structure of the aforementioned void volume and porosity characteristics, and may be formed of any suitable material, as for example metal, ceramic, glass, etc., with sintered porous metal or glass frit elements preferred as the active vaporizer element.

In one specific embodiment of the invention, useful for high flux vaporization at low flow rates of source reagent liquid, the passage member is of cylindrical elongate form, with a disk-like vaporization element in the form of a frit, perpendicular to the longitudinal axis of the flow passage, and in abutting relationship at its periphery with the inner wall of the flow passage, to thereby define a restricted vaporization region for high flux vaporization of the source reagent liquid. In such vaporizer construction, the source reagent liquid is conveyed to the vaporization element by a centrally axially extending liquid supply conduit terminating at a discharge end located in close proximity to the vaporization element surface. By way of illustration, the spacing dimension between the terminus of the reagent source liquid supply conduit and the surface of the vaporization element may be on the order of 5 mils or less, whereby liquid discharge from the liquid feed conduit is effectively dispersed radially outwardly onto the vaporization element in a thin film, to effectuate high flux vaporization thereof. The source reagent liquid supply conduit suitably has a small internal diameter, to provide a rapid pressure drop in the liquid discharged onto the vaporization element surface. By way of example, the internal diameter of the liquid feed conduit may be on the order of between 0.001 inch to 0.030 inch, with the liquid feed conduit being disposed in a flow passage defined by a tube which may, for example, be on the order of ⅝ inch inner diameter, whereby the cross-sectional area ratio of the liquid feed conduit to the cross-sectional area of the flow passage may be on the order of from about 10 to about 50, consistent with effective utilization of the entire vaporization element surface and volume.

In another high flux vaporizer embodiment, useful for high flows of source reagent liquid, the flow passage may have a wall-within-a-wall construction, wherein the flow passage is defined by a housing wall, which may for example be of a cylindrical or tubular shape, with transverse circumferentially extending channels at spaced intervals along the length of such flow passage, wherein the channels are connected by a liquid feed manifold channel extending longitudinally in the direction of the axis of the flow passage and interconnecting the transverse circumferential channels, and with the inner wall surface of the flow passage being in an abutting relationship to a vaporization element extending circumferentially around the entire interior wall surface of the flow passage and longitudinally therealong to overlie the transverse channels, as well as the liquid feed manifold channel. The liquid feed manifold channel may be coupled with a source reagent liquid inlet conduit, so that source reagent liquid is introduced to the longitudinal manifold channel for distribution to the transverse circumferentially extending flow channels, and so that the source reagent liquid is contacted with the vaporization element over an extended longitudinal as well as circumferential area. The flow passage wall in such embodiment may be heated by suitable heating means such as a heating coil, jacket, embedded resistance elements, etc., whereby the vaporization structure in contact with the flow passage wall is heated to elevated temperature, to effect a high flux vaporization of the source reagent liquid, for subsequent transport through the flow passage to the chemical vapor deposition reactor.

In another aspect, the invention relates a high flux vaporizer apparatus of a type as variously described above, in closed flow communication with a chemical vapor deposition reactor containing a mounting structure for a substrate, for deposition of one or more components from the volatilized source reagent vapor deriving from the source reagent liquid, as vaporized in the vaporizer apparatus by contact of the source reagent liquid with the porous vaporization element.

Other aspects and features of the invention will be more fully apparent from the ensuing disclosure and appended claims.

DETAILED DESCRIPTION OF THE INVENTION, AND PREFERRED EMBODIMENTS THEREOF

Figure 1:
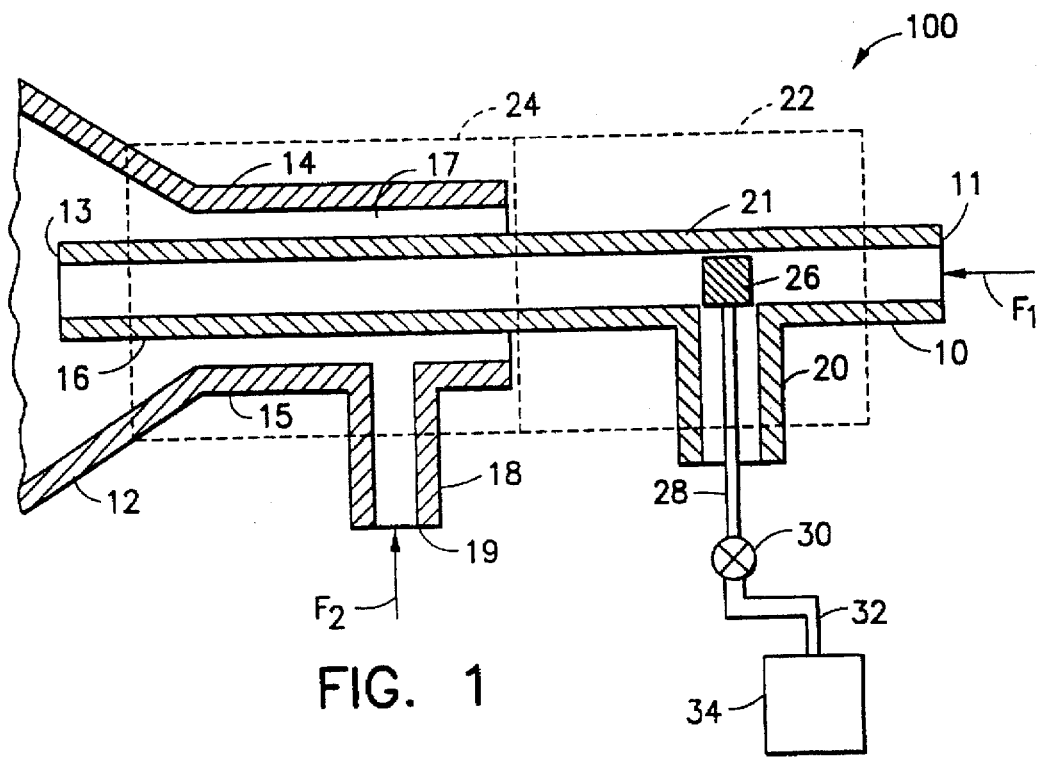
FIG. 1 is a schematic representation of a source reagent liquid delivery system for flash vaporizing a source reagent.

Referring now to the drawings, FIG. 1 shows a schematic representation of a delivery system 100 for a liquid source reagent.

The delivery system includes a first fluid feed passage 10 into which a first fluid is introduced in the direction indicated by arrow $F_1$. The first fluid may comprise a carrier gas, such as argon, as well as other gaseous components, e.g., volatile source compounds for elements such as copper, yttrium, etc.

The first fluid feed passage 10 is connected to a gas distribution manifold at its proximal end 11, and is open at its distal end 13. The distal portion 16 of passage 10 is mounted in a housing 12 of a reactor 14, such as a CVD growth chamber. The distal portion 16 of the first fluid feed passage 10 thus is centrally disposed in the cylindrical portion 15 of the CVD reactor 12, to form an annular interior volume 17 therebetween.

Communicating with the annular interior volume 17 is a second fluid flow passage 18, into which second fluid is introduced in the direction indicated by arrow $F_2$, through the open end 19 of the passage. The second fluid introduced in passage 18 to the reactor may include other source reagent materials, or components or carrier gas species, such as oxygen and argon in the case of HTSC film formation systems.

Disposed in the proximal portion 21 of the first fluid flow passage 10 is a flash vaporization matrix structure 26, which is joined in liquid delivery relationship by conduit 28 and conduit 32, having check valve 30 therebetween, to liquid reservoir 34. Conduit 28 is sized and arranged (mounted on flash vaporization matrix structure 26) in such manner as to prevent premature evaporation of any volatile components (e.g., solvent constituents) of the source liquid which is flowed through conduit 28 to the vaporization matrix structure for flash vaporization thereon. The conduit 28 extends through lateral extension 20 of first fluid flow passage 10. Liquid reservoir 34 is constructed and arranged to hold a reagent source liquid, e.g., a solution comprising an involatile reagent and a suitable solvent therefor, or if the reagent is a suitable liquid, then the reagent alone.

The delivery system 100 shown in FIG. 1 comprises a vaporization zone 22, which may be maintained at a suitable elevated temperature commensurate with the flash vaporization of reagent source liquid on the flash vaporization matrix structure 26.

Downstream from the vaporization zone 22 is an injection zone 24, wherein the second fluid is introduced via second fluid flow passage 18. The injection zone 24 is maintained at a suitable temperature, which may be somewhat less than the temperature of the vaporization zone, depending on the various constituents introduced through the respective first and second fluid flow feed passages.

In operation, the first fluid is flowed in the direction $F_1$ through first fluid flow passage 10 into the reactor 12, being discharged at the distal open end 13 of the first fluid flow passage 10. Concurrently with such flow of gas therethrough, the reagent source liquid from reservoir 34 is flowed through conduit 32, check valve 30, and conduit 28, to the flash vaporization matrix structure 26.

The flash vaporization matrix structure 26 may be formed of any suitable material which does not deleteriously interact with the reagent source liquid or other fluid species introduced into the first fluid flow passage. The matrix structure should also be heatable to sufficient elevated temperature to effect flash vaporization of the reagent source liquid which is introduced from conduit 28 onto the surfaces of the matrix structure. The matrix structure may for example be formed of metals such as stainless steel, copper, silver, iridium, platinum, etc., as well as ceramics, high temperature glasses, composite materials, and the like, the choice of a specific material of construction being dependent on the temperature regime which is encountered by the matrix structure, as well as the composition of the reagent source liquid and fluid flowed past the structure in the first fluid flow passage 10. Preferably, the matrix structure is constructed of an inert metal, and has a relatively high surface-to-volume ratio, as for example at least about 4, more preferably at least about 10, and most preferably at least about 100, when the surface and volume are measured in corresponding area and volume dimensional units (viz., square and cubic values of the same dimensional units). Preferably the matrix structure is foraminous (i.e., porous or perforate) in character.

The flash vaporization matrix structure may take the form of a screen, porous sintered material body, grid, or the like, as described hereinafter in greater detail. The composition, surface area, and surface-to-volume characteristics of the matrix structure are selected so as to effect flash vaporization of the involatile reagent source liquid on the surfaces of the structure, near contemporaneously with application of liquid thereon.

The conduit 28 introducing the reagent source liquid onto the matrix structure 26 may simply be an open-ended tube, i.e., a robe whose open end communicates with the matrix structure, whereby liquid issuing from the conduit flows onto the surfaces of the matrix structure for flash vaporization thereon, when the grid is heated to suitable elevated temperature. As previously discussed, conduit 28 is appropriately sized and arranged relative to the vaporization matrix structure 26 to prevent any undesirable premature evaporation of the reagent source liquid before the flash vaporization thereof on the matrix structure.

In order to enhance the dispersion and distribution of reagent solution onto the surfaces of the matrix structure, the conduit 28 may have a restriction rod (not shown) centrally disposed therein to form an interior annular conduit, whereby pressure drop in the conduit is adjusted to a desired level, and whereby liquid appropriately issues in a thin film onto the matrix structure surfaces. Alternatively, the conduit 28 may be joined to a suitable nozzle or distributor means (not shown) at the distal end of the conduit, to facilitate distribution of source reagent liquid onto the matrix structure surfaces.

The source reagent solution reservoir 34 may be associated or otherwise coupled with a suitable liquid pumping means (not shown), such as a positive displacement liquid pump which effects discharge of reagent source liquid from the reservoir through conduit 32, check valve 30, and conduit 28 to the matrix structure 26. The reagent source liquid may be introduced onto the vaporization matrix structure in a steady stream injection mode or in a pulsed injection mode from the conduit 28. In general, steady stream injection of the reagent source liquid is desirable in CVD applications since it provides the most stable concentration of the source reagent in the downstream reactor, however, pulsed injection of the reagent source liquid may be advantageous in some applications.

Preferably, the matrix structure 26 is formed of a material of construction having a high specific heat capacity, so that the structure is substantially unaffected by heat of vaporization effects, whereby the matrix structure is suitably maintained at a desirable elevated temperature for continuous operation and vaporization of the reagent source liquid. Materials of construction which may contaminate the deposited films sought to be formed from the source reagent liquid, e.g., iron, should be avoided in the practice of the invention, in applications where the composition and stoichiometry of the deposited film are critical.

The check valve 30 between conduits 28 and 32 controls the on/off flow of reagent source liquid therethrough to the matrix structure 26 and is required to prevent the uncontrolled delivery of the source reagent solution to the matrix structure 26 under reduced pressure operating conditions.

The reagent source liquid delivered to the heated matrix structure 26 is vaporized and then carried by a first fluid (carrier gas) into the deposition reaction chamber 12. The first fluid may also comprise other reagents from various upstream bubblers or other source means therefor.

Figure 2:
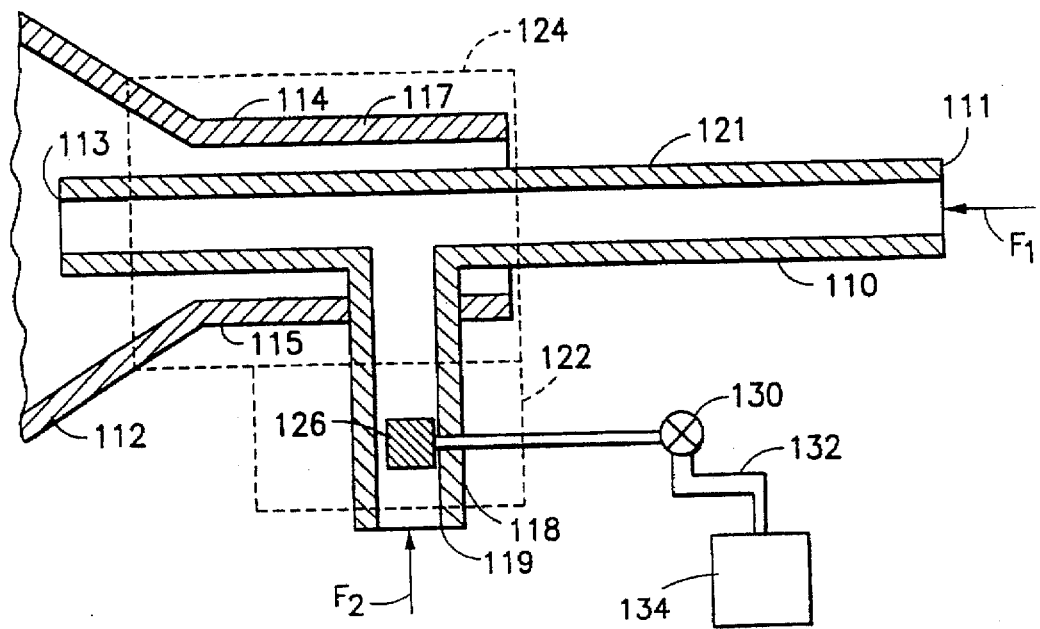
FIG. 2 is a schematic representation of another source reagent liquid delivery system for flash vaporizing a source reagent.

FIG. 2 is a schematic representation of another delivery system for flash vaporizing an involatile reagent, which is numbered correspondingly with respect to FIG. 1, by addition of 100 to all reference numerals of corresponding parts and elements of the FIG. 1 system.

The FIG. 2 system is constructed and arranged correspondingly to the FIG. 1 system, with the exception that the vaporization matrix structure 126 is disposed in the second fluid flow passage 118 in the FIG. 1 system, rather than being disposed in the proximal portion of the first flow passage as shown and described with respect to the FIG. 1 system.

In connection with such difference, the first fluid flow passage 110 in the FIG. 2 system does not have a lateral extension at the proximal end of the first fluid flow passage, as does the FIG. 1 system. By the arrangement shown in FIG. 2, the flash-vaporized reagent source liquid flows with the gas introduced into second fluid flow passage 118, to the annular interior volume 117 and to the housing 112 of a reactor 114, e.g., a CVD growth chamber. The second fluid which is introduced in second fluid flow passage 118 to the reactor may include any suitable source reagent materials, components, or carrier gas species, as previously described in connection with FIG. 1. In all other respects, the FIG. 2 system may be operated correspondingly to the FIG. 1 system, to provide the flash-vaporized involatile reagent to the desired processing locus.

The delivery system embodiments illustratively described hereinabove can be used with any deposition reactor configuration and heating method. Examples of suitable deposition reactor and heating modalities include horizontal reactors with infrared (IR) heating, vertical reactors with resistive heating, and vertical reactors with inductive heating.

The delivery system of the present invention is broadly applicable to application of flash vaporized involatile reagent materials to substrates by MOCVD, plasma enhanced chemical vapor deposition (PECVD), photoassisted-CVD, other forms of assisted-CVD, and conventional thermal CVD, with the choice of the specific deposition technique being within the skill of the art, as regards any particular film formation application.

It is also within the purview of the invention to provide a plurality of relatively involatile reagent species in a suitable solvent medium to form a source liquid solution. Regardless of the number of relatively involatile reagent species employed, the solvent medium may be widely varied, and may comprise single component solvents as well as multi-component solvent mixtures, with the choice of a specific solvent medium being readily determinable for a given reagent or reagents, and the specific flash vaporization apparatus and flash vaporization conditions employed.

It is also within the broad purview of the present invention to utilize a solution of an involatile reagent as the source liquid for flash vaporization, wherein the solvent has an extremely low-volatility such that it is not vaporized during the flash vaporization of the involatile reagent from the solution, but remains in the liquid state. In this manner, the source liquid introduction means and the flash vaporization matrix structure may be arranged and operated so that the non-vaporized solvent is collected at or proximate to the site of flash vaporization, and recirculated for reuse. The advantage of such arrangement and operation of the system is that the solvent medium does not become associated with the flash vaporized involatile reagent, and thus is not carried with the vapor-phase reagent into the downstream reactor or other downstream processing locus, such as is the case when the solvent is co-flashed with the involatile reagent. By utilizing a solvent which is non-vaporized on the vaporization matrix in CVD applications, the solvent is not carried into the deposition reactor where it could otherwise contaminate the growing film. As an example, in plasma enhanced CVD growth, contamination of the growing film by an organic solvent may create problems which render the product film deficient or even useless for its intended purpose.

An illustrative example of a non-flashing low volatility solvent which may be usefully employed in the broad practice of the present invention is the perfluorinated ether commercially available under the trademark Krytox®, which may be employed for example with a tetraglyme adduct dissolved therein to provide the reagent source liquid for flash vaporization.

When a solvent is employed to dissolve the involatile reagent and form a reagent source solution thereof for subsequent flash vaporization of the involatile reagent, the solvent must meet certain criteria. When the solvent is to be co-flashed with the involatile reagent, the solvent medium should be more volatile than the source reagent itself. In such case, the solvent medium should not react with the reagent to form a less volatile product. With respect to the interaction between the solvent and the involatile reagent, three vaporization scenarios are possible, in order of decreasing solvent flashing effectiveness:

(1) The solvent forms an adduct with the molecule of interest, the adduct having enhanced volatility (2) The solvent strongly associates with the molecule of interest, and forms a non-ideal gas during vaporization, thereby increasing the effective vapor pressure of the source reagent; and (3) The solvent only weakly interacts with the source reagent, and these two species co-vaporize with little or no enhancement of the vapor pressure of the molecule of interest.

Alternatively, a fourth scenario appropriately describes the use of a non-flashing low volatility solvent:

(4) The solvent only weakly interacts with the source reagent, so that the source reagent is vaporized with little or no enhancement of the vapor pressure of the molecule of interest, but the solvent has extremely low volatility and remains in the liquid state, or else quickly recondenses in proximity to the flash vaporization matrix structure, so that the solvent may be readily collected for reuse in the system.

The specific choice of solvent for a given reagent deposition application will depend on the composition of the reagent and solubility of the reagent in the selected solvent. The choice of a specific solvent thus may be made without undue experimentation by those skilled in the art, based on simple compatibility, solubility, and vaporization tests.

Depending on the identity of the specific reagent compound to be dissolved therein and subsequently flash vaporized, potentially usefully employed co-flash vaporizable solvents in the broad practice of the present invention include alkanolic solvents and alcohols generally, as well as ethers, and amines. The solvent should not contain any materials, or decompose to form any materials, which deleteriously contaminate the films or layers deposited from the vaporized source reagent solution. For this purpose, sulfoxide solvents should not be used in the formation of high temperature superconductor (HTSC) layers on substrates, since the sulfoxide solvent will contaminate the resulting HTSC film. When the solvent is to be maintained in the liquid phase while the involatile reagent is flash vaporized from a reagent source liquid containing the involatile reagent, halogenated organic solvents such as the Krytox® perfluorinated either may be employed, as previously discussed.

Although the involatile reagent delivery system of the invention has been described with reference to the embodiments of FIGS. 1 and 2, as involving a carrier gas with which the flash vaporized involatile reagent is mixed to form a resulting source gas mixture for subsequent processing, it is within the broad purview of the present invention to operate without the provision of any carrier gas, so that the flash vaporized material is flowed without any additional components, or materials to the downstream treatment or processing locus. This may be effected by operating a downstream processing chamber, e.g., a CVD growth reactor, at a pressure below that of the flash vaporization chamber, so that the flashed vapor flows under the differential pressure conditions from the vaporization chamber to the downstream processing chamber.

The reagent employed in the broad practice of the present invention may be of any of widely varying types, depending on solvent employed and the specific end use application for which the reagent is intended.

Potentially useful involatile reagents in the broad practice of the present invention include Group II reagents, such as organometallic compounds and complexes of Group II elements.

By way of example, in the formation of Group II metal fluoride (e.g., $BaF_2/CaF_2/SrF_2$) interlayers, between silicon substrates and HTSC or GaAs overlayers, suitable Group II involatile source reagents may comprise: barium 1,1,1,2,2, 3,3,-heptafluoro-7,7-dimethyl-octane-4,6-dionate, hereafter denoted Ba(fod)$_2$; calcium 1,1,1,2,2,3,3-heptafluoro-7,7-dimethyl-octane-4,6-dionate, hereafter denoted (Ca(fod)$_2$; strontium 1,1,1,2,2,3,3-heptafluoro-7,7-dimethyl-octane-4,6-dionate, hereafter denoted Sr(fod)$_2$; hexafluoroacetylacetonate compounds of barium, calcium, and strontium, and adducts of such hexafluoroacetyleacetonate compounds with tetraglyme.

In the formation of HTSC films of BiSrCaCuO by MOCVD, wherein the strontium and calcium reagents are introduced as vaporized solutions of the materials, the calcium involatile reagent may be Ca(fod)$_2$ and the strontium reagent may be Sr(fod)$_2$.

Reagents such as Ba(fod)$_2$; barium hexafluoroacetylacetonate; barium hexafluoroacetylacetonate/tetraglyme adduct; 1,2,3,4,5-pentamethyl-1,3-cyclopentadienyl barium; and barium bis(2,2,6,6-tetramethyl-3,5-heptanedione) may suitably be employed as involatile Group II reagents for barium in the MOCVD formation of HTSC films of the "123" type (YBa$_2$Cu$_3$O$_x$, wherein x is from about 6.0 to about 7.3).

The present invention is generally applicable to the delivery of Group II elements from Group II beta-diketonate source reagent compounds, including the aforementioned Ba(Fod)$_2$, Ca(fod)$_2$, and Sr(fod)$_2$ compounds. For the Group II beta-diketonate source reagent compounds, alcohols generally are preferred as solvent species, particularly alkanolic solvents, e.g., isopropanol, butanol, and the like.

Figure 3:
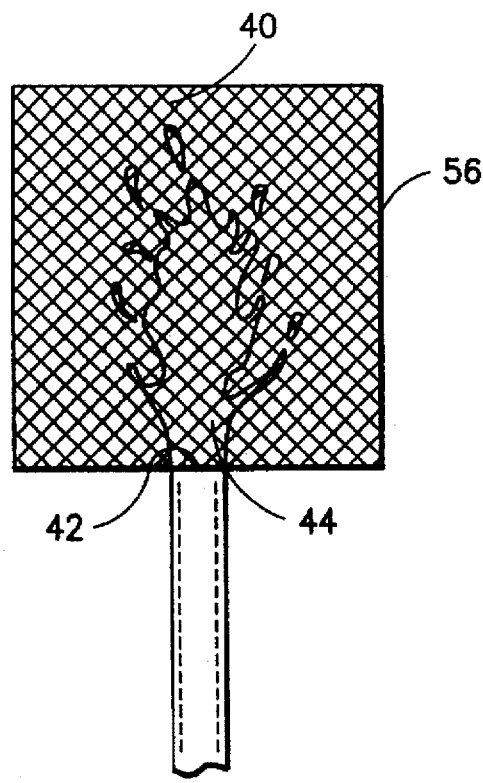
FIG. 3 is a front elevation view of a flash vaporization matrix structure such as may be employed in the FIG. 1 system.

FIG. 3 is a from elevation view of the flash vaporization matrix structure 26 which is shown in FIG. 1, as associated with reagent source liquid feed conduit 28. The matrix structure 26 may suitably comprise a screen 40 formed of criss-crossed wire strands yielding a foraminous structure, to which the distal end 42 of reagent source liquid feed conduit 28 is suitably attached, e.g., by welding, brazing, or the like. In such manner, fluid flow communication is provided between the interior passage of conduit 28 and the matrix structure 26, to effect flow of liquid 44 from the conduit onto the surfaces of the matrix structure 26, for vaporization of the reagent source liquid thereon.

Figure 4:
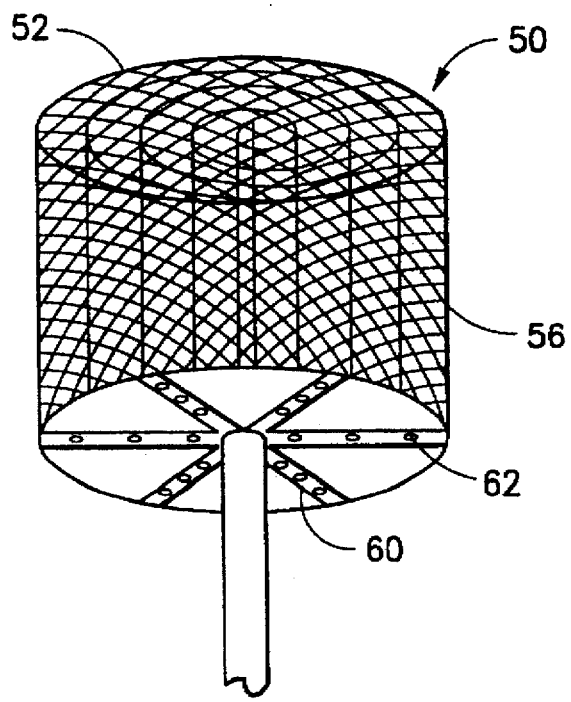
FIG. 4 is a perspective view of an alternative flash vaporization matrix structure.

FIG. 4 shows a perspective view of another flash vaporization matrix structure assembly 50, comprising a spiral wound screen 52, to the lower end 54 of which is joined a liquid distributor 56, which in turn is joined to and fed by reagent source liquid feed conduit 58. The distributor assembly 56 comprises a series of radially extending arms 60, which in turn have liquid flow openings 62 on their upper portions, to accommodate discharge of liquid therethrough, as supplied by the feed conduit 58.

In operation of the FIG. 4 assembly, reagent source liquid flows through feed conduit 58 into the arms 60 of the distributor assembly 56 and is discharged through openings 62 in the form of free jets of liquid onto the surfaces of the screen mesh 52 which is at elevated temperature, for vaporization on the surfaces thereof.

Figure 5:
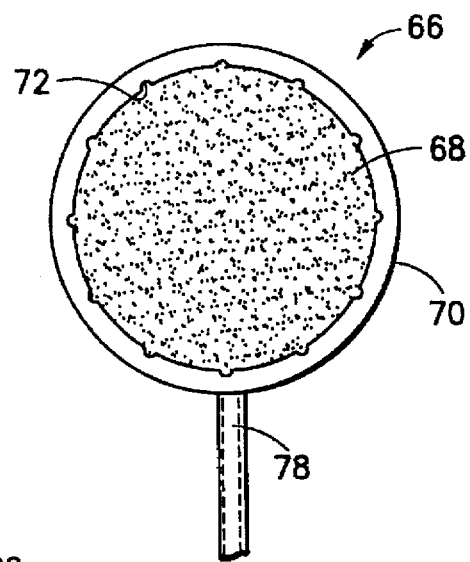
FIG. 5 is a front elevation view of a still further embodiment of a flash vaporization matrix structure.

FIG. 5 is a front elevation view of another flash vaporization matrix structure assembly 66, which features a porous sintered metal disk 68 which about its periphery is circumscribed by a distributor ring 70 having openings 72 on its inner surface. The ring 70 is hollow in its interior to define a flow passage therein. This interior flow passage is in flow communication with the reagent source liquid feed conduit 78, which in turn is joined in closed flow communication to ring 70.

In operation of the FIG. 5 assembly, reagent source liquid is flowed through feed conduit 78 into ring 70 and issues through the inner openings 72 thereof onto the surfaces of the porous sintered metal matrix 68. The sintered metal matrix is maintained at elevated temperature, for vaporization of the reagent source liquid thereon.

Figure 6:
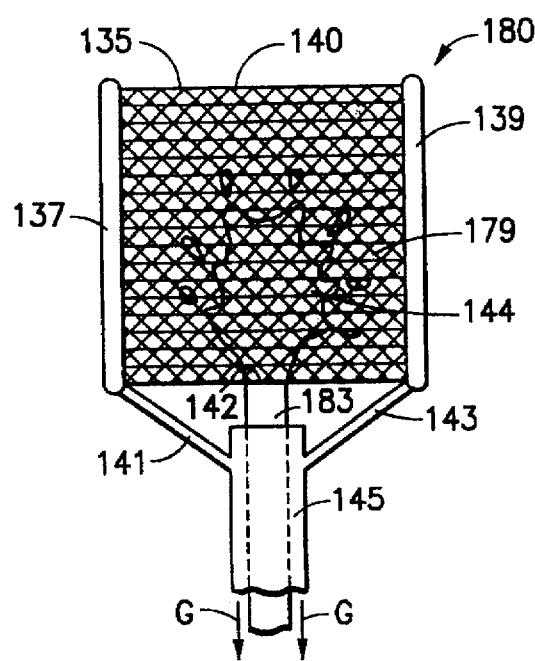
FIG. 6 is a front elevation view of a flash vaporization matrix structure, of a type suitable for use with a carrier solvent having extremely low volatility, and comprising means for recovery and, if desired, recirculation of the carrier solvent.

FIG. 6 is a from elevation view of a flash vaporization matrix structure which may be employed to flash vaporize reagent source liquid comprising a non-vaporized solvent which is recovered for reuse, contemporaneously with the flash vaporization of the involatile reagent from the reagent source liquid introduced onto the vaporization matrix structure.

Referring to FIG. 6, the flash vaporization assembly 180 comprises a vaporization matrix structure 179, which is associated with a reagent source liquid feed conduit 183. The matrix structure 179 may suitably comprise a screen 140 formed of wire mesh elements providing a foraminous member. The matrix structure 179 is attached to the distal end 142 of the reagent source liquid feed conduit 183 in any suitably manner of affixation, to provide fluid flow communication between the interior passage of conduit 183 and the matrix structure 179. By this arrangement, liquid 144 is flowed from conduit 183 onto the surfaces of the screen 140, with the screen being maintained at suitably high temperature, to effect flash vaporization of the involatile reagent source compound from the source liquid comprising same.

The FIG. 6 flash vaporization assembly is particularly adapted for the recovery of non-vaporized solvent from the source liquid 144, by the provision of transverse wick elements 135. The transverse wick elements extend across the screen 140 and terminate at the margins of the screen, in wicking flow communication with the manifold members 137 and 139, respectively. The manifold members 137 and 139 in turn are connected in liquid flow communication, means of by branch return conduits 141 and 143, respectively, to return conduit 145. As is shown, the return conduit 145 concentrically surrounds the liquid feed conduit 183, to provide an annular flow space therebetween, whereby recovered solvent is returned to the feed reservoir or other collection locus, flowing in the direction indicated by the arrows G.

In operation of the FIG. 6 vaporization assembly, source reagent liquid 144 is injected by feed conduit 183 onto the surfaces of screen 140, which as indicated is maintained at suitably high temperature to effect high flux vaporization of the reagent. The liquid 144, which may for example comprise a relatively involatile reagent in a non-vaporizable solvent, may be separated into the flashed involatile reagent component, and the non-vaporized solvent which remains on the screen 140, and then is wicked transversely by the wicking elements 135 to the manifolds 137 and 139 at the margins of the screen. Liquid collected in the manifolds 137 and 139 flows by branch lines 141 and 143, respectively, to the return conduit 145 for reuse.

It will be appreciated that other collection means and methods may be employed to recover a solvent from the volatilized source reagent liquid, within the broad practice of the present invention.

In the broad practice of the invention, BaTiO$_3$ and Ba$_x$Sr$_{1-x}$TiO$_3$ thin film have been grown by simultaneous delivery of relatively involatile Ba, Sr and Ti organometallic compounds in a single liquid solution to the film growth reactor. Simultaneous delivery of all the active species to substrates via a single manifold can be advantageous as compared to separate precursor manifolds in terms of Ba:Ti and Ba:Sr:Ti stoichiometry in the films.

Delivery of multiple reagents in a single liquid injection system is also applicable to CVD growth of other useful thin film materials such as boro-phosphorus-silicate glass (BPSG), $Ta_2O_5$, $TiO_2$, and composite films of these and other constituents. This type of approach is very reproducible in terms of film stoichiometry, and represents a significant advance in the state-of-the-art for MOCVD growth of complex oxide materials.

For example, the apparatus of the invention may be employed for transport and flash vaporization of Ba, Sr and Ti MOCVD precursor reagents dissolved in a single solution. The solvent used for transport of the organometallics to the reactor must be capable of being volatilized at a temperature below the decomposition temperature of the precursor reagents and must be a good solvent for the reagents. For example, 90% isopropanol, 10% tetraethylene glycol dimethyl ether (by volume) has been used with good results. The Ba, Sr, and Ti organo-metallic compounds may be well-known CVD source reagents such as barium bis-tetramethylheptanediaonate $(Ba(thd)_2)$, strontium bis-tetramethylheptanediaonate $(Sr(thd)_2)$ and titanium bis-isopropoxide-bis-tetramethylheptanedionate $(Ti(OPr)_2(thd)_2)$. Typical solute concentrations are 0.1M total for the Group IIa organo-metallic compounds and 0.1M for the titanium compound. These concentration ratios in the liquid are identical to the desired film stoichiometry, although in general the characteristics of a specific CVD reactor (temperature, pressure, flow, presence of radicals) may require different action ratios in the precursor liquid. Variation of Ba/Sr ratio in the film can be achieved by varying the concentrations of the corresponding precursors in solution as appropriate. Such variation may be desirable to modify the temperature-dependent dielectric properties of the film as required for a particular application.

The solution (both solvent and solutes) is delivered onto a heated metal surface or flit and is vaporized there. Highly reproducible delivery can be achieved through use of a syringe pump. The liquid enters the vacuum system through a check valve which opens at pressures greater than atmospheric pressure but below the pressure limit of the syringe pump. Typical liquid flow rate is 4.0 ml/hour. The metal surface is a ¼" diameter ¹⁄₁₆" thick stainless steel flit with 20 micrometer pore size, which has a large surface area. The porous disk is held at 230° C. The liquid can then wet this surface in a thin layer. The solvent evaporates, and the small volume of solute left there can sublime, and be carried, as a vapor, into the reactor and to the substrate by the Ar or other carrier gas flowing through the vaporization region. Argon flows through the porous disk in the same direction as the liquid, to facilitate transport of the vapor phase solvent and organometallics into the reactor. Typically, the flow of the Ar carrier gas is on the order of about 100 sccm.

A small volume of the source reagent therefore may be kept at the sublimation temperature for a very short time, effectively preventing premature decomposition. Premature decomposition at temperatures near the sublimation temperature is a major shortcoming typical of Ba and Sr organometallics. This flow-wetting-evaporation/sublimation sequence takes place on a continuing basis, i.e., liquid flow is continuous. Efficient sublimation of the deposited solute is a critical characteristic which depends on the metallorganic compounds used as the reagent and on the temperature of the metal surface where the liquid is incident. Pressure gradients in the region of the vaporization zone are also important. Control of the vaporization zone temperature and temperature gradients is not trivial because of the strong cooling effect of the solvent evaporation.

Figure 7:
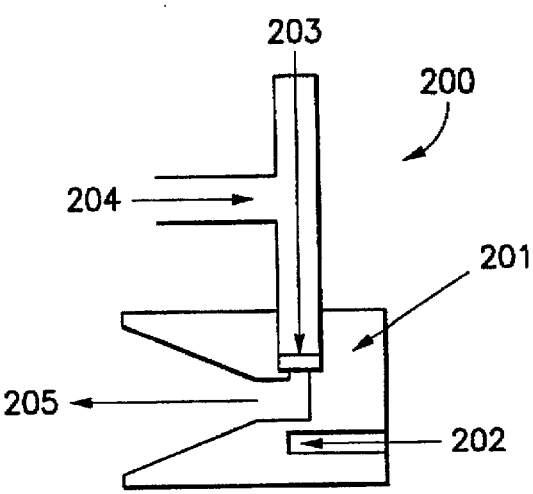
FIG. 7 is a schematic of a vaporization zone.

A schematic of the vaporization zone 200 is shown in FIG. 7. The main body of the apparatus is a 1" diameter stainless steel cylinder 201 which has been machined as shown in this cross-sectional view. Since the thermal conductivity of the stainless steel block is relatively poor, an axially symmetric aluminum jacket (not shown) is clamped around the stainless steel cylinder, and is heated uniformly by resistive heaters clamped in contact with the aluminum. A thermocouple 202 embedded near the porous frit 203 is used to measure temperature, which is controlled by a proportional controller that powers the heaters. Carrier gas flows in inlet 204 and reagent-laden gas flow to the reactor via port 205.

The Ba and Ti carrying gas enters the vertically oriented reactor at the bottom. At this point oxygen is also entering the reactor, at 100 sccm. Total pressure at the substrate is approximately 0.5 Torr, although use of the liquid delivery apparatus described above can be for film growth at any pressure. The relative partial pressures of Ti, Sr and Ba at the substrate are controlled by varying the pumping rate of the solution and the concentration of the metalorganic species in the solution.

Figure 8:
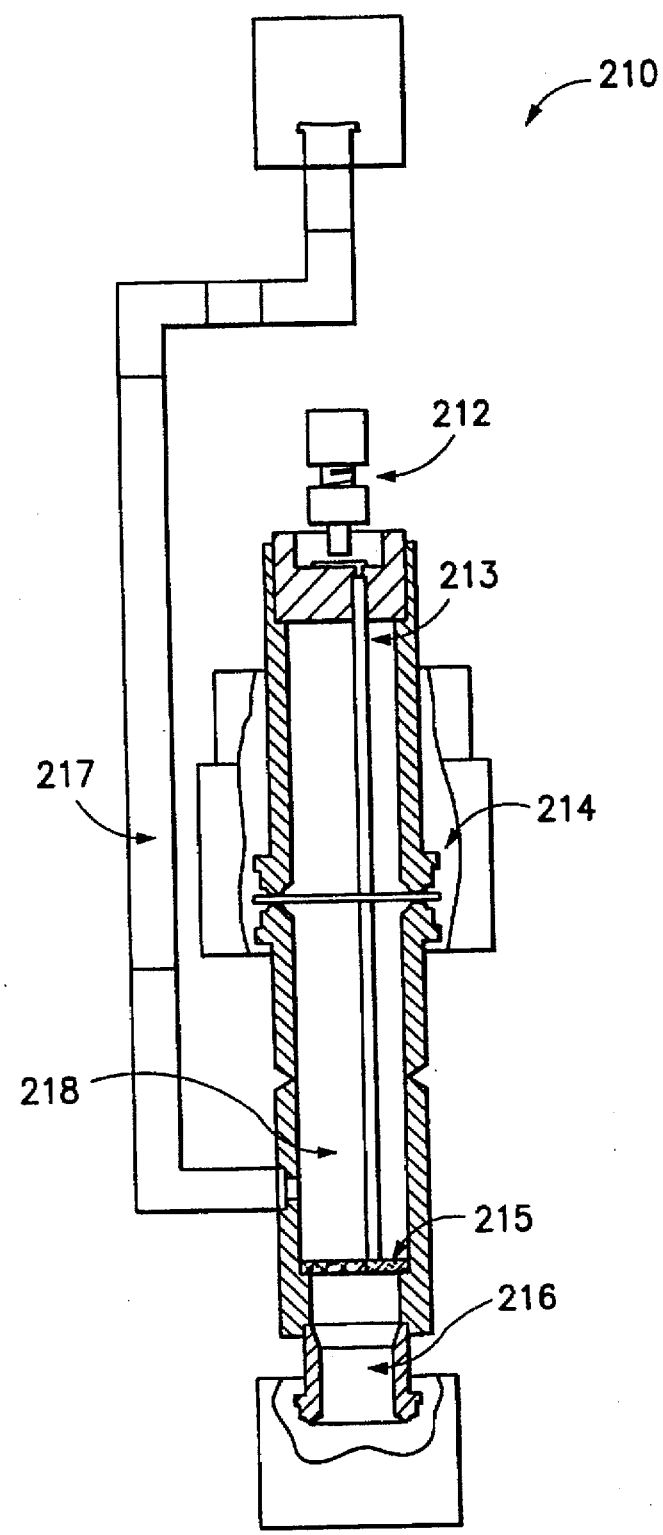
FIG. 8 shows a cross-sectional view of a delivery system for flash vaporizing a source reagent.

FIG. 8 shows another useful configuration of the delivery system 210 for flash vaporizing a source reagent or source reagent solution. In this configuration, a liquid reagent or reagent solution is pumped through fitting 212 into robe 213, whence it flows onto porous frit 215 which is heated to a temperature sufficient to flash vaporize the reagent. Reagent gases then flow downstream to the reactor via port 216. Inert carrier gas such as nitrogen or argon is flowed into chamber 218 via tube 217. The inner diameter and length of tube 213 can be varied in order to control the pressure drop between fitting 212 and the downstream reactor. It is desirable to hold the pressure drop constant so that the rate of pumping reagent into the system can be used to control the rate of reagent delivery into the reactor. The inner diameter of tube 213 can range from $1 \times 10^{-4}$ to $20 \times 10^{-4}$ inches, preferably $4 \times 10^{-4}$ to $10 \times 10^{-4}$ inches. The number of these tubes can range from 1 to 3. The type of pump used can be of any kind capable of delivering a constant stream of reagent liquid. Piston pumps of the type used in high performance liquid chromatography are suitable. The heated frit may be made of any material that is inert in the presence of the reagents at the appropriate temperatures. Stainless steel, glass, and ceramics are suitable materials of construction. The frit may have a pore size of from 2 to 200 µm, with 10 to 20 µm being preferred. A gasket 214 enables the system to be disassembled easily for cleaning.

It will be recognized that the vaporization matrix may be provided in a structural form which can be widely varied, depending on the nature of the liquid to be flash vaporized thereon, and the operating conditions and end use application for the reagent material of interest. Thus, for example, the flash vaporization matrix structure could comprise a permeable housing or "cage" filled with tiny particulate packing elements providing extending surface area, for flash vaporization of reagent source liquid solution introduced thereonto when the packing material is maintained at elevated temperature.

Alternatively, the structure of the flash vaporization matrix may embody a wick element serving to draw reagent source liquid onto its surfaces from an associated liquid feed conduit by capillary action.

Accordingly, the term "flash vaporization matrix structure" is to be broadly construed to include all suitable physical structures comprising physical element(s) which are arranged to receive a liquid reagent and to vaporize the received liquid when the physical element(s) are heated to a sufficiently high flash vaporization temperature for the specific liquid employed.

Figure 9:
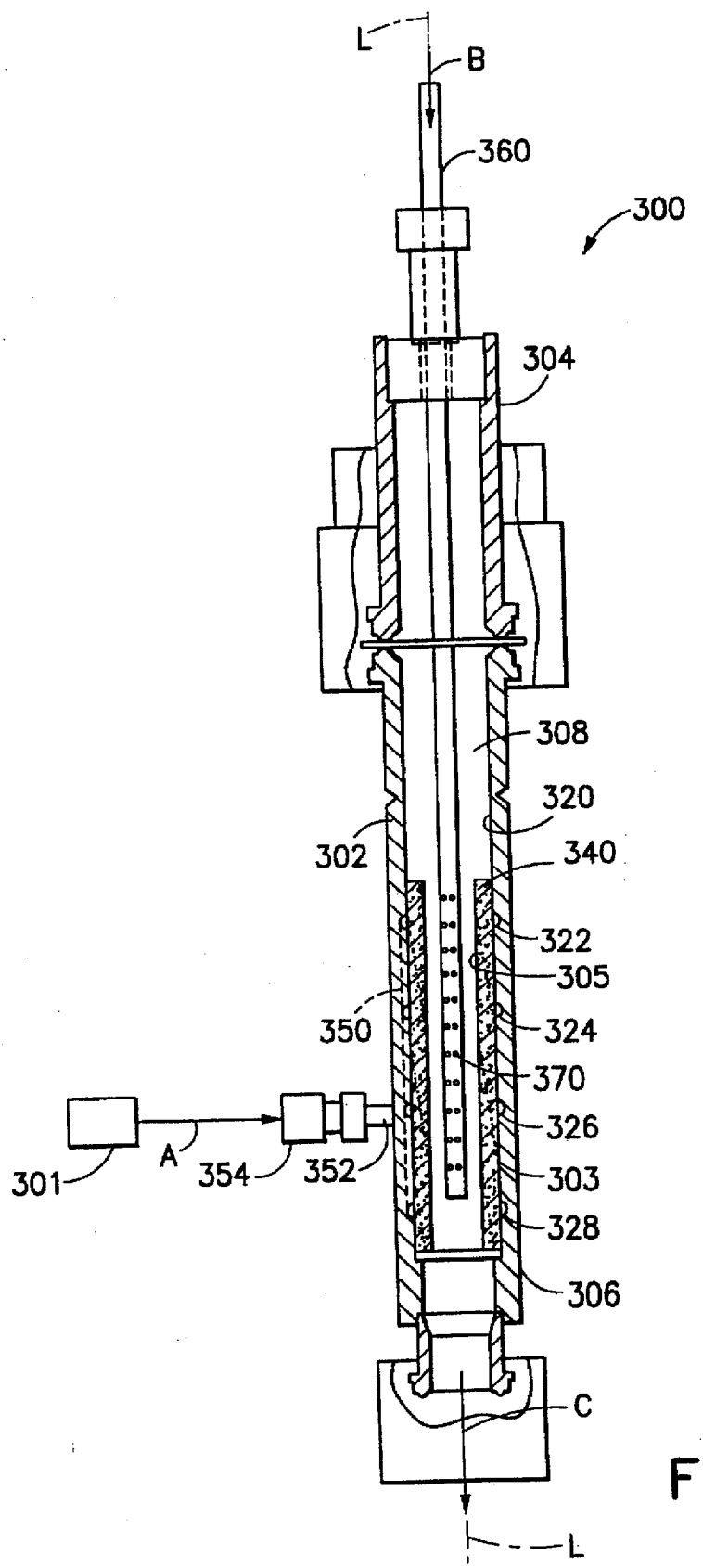
FIG. 9 is a schematic illustration of a vaporization apparatus 300 according to another embodiment of the invention.
Figure 10:
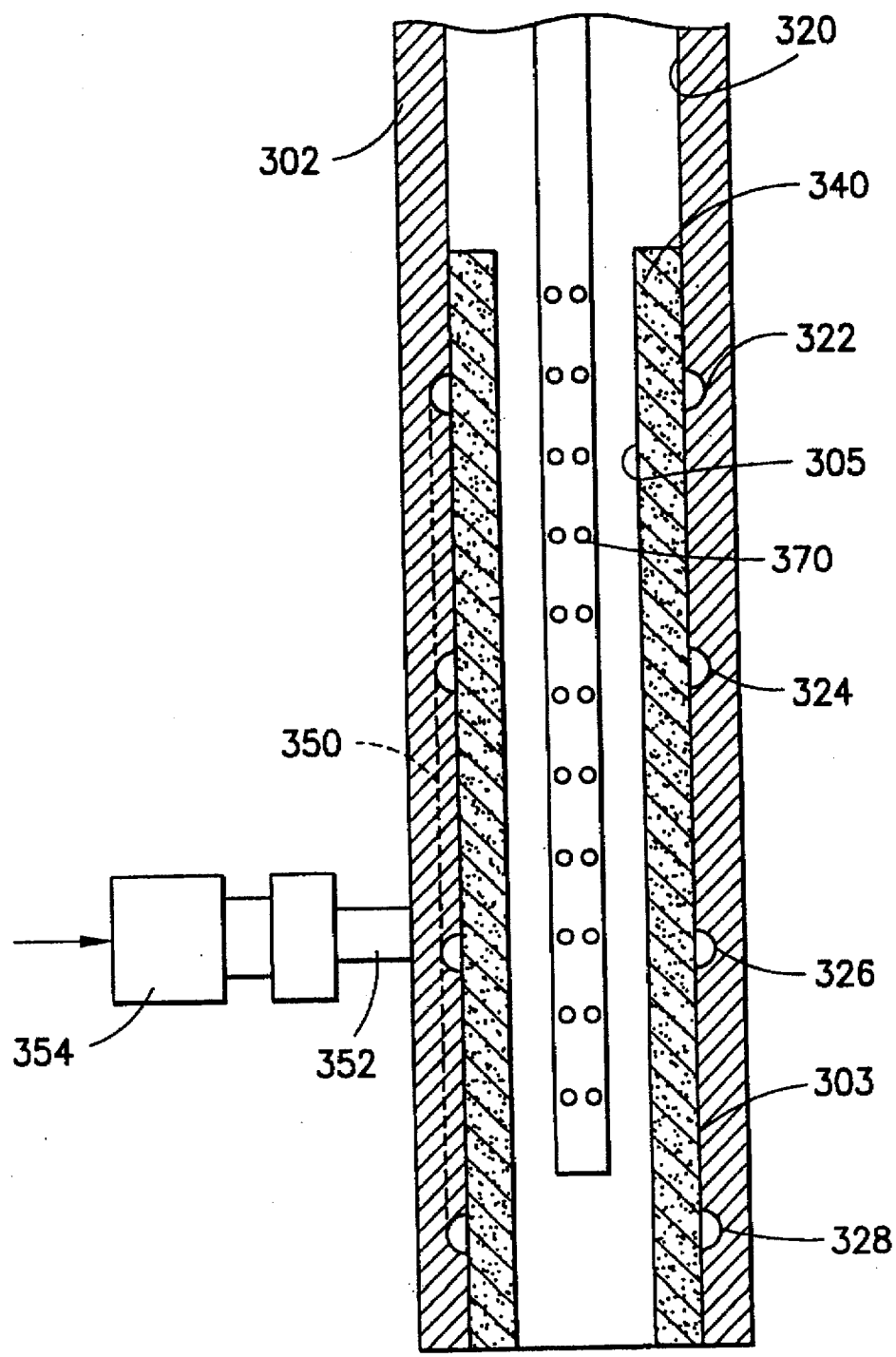
FIG. 10 is an enlarged sectional view of apparatus shown in FIG. 9 and described hereinabove.

The flash vaporization matrix structure may be maintained at suitably high elevated temperature to effect flash vaporization of the reagent source liquid thereon in any suitable manner. For example, the matrix structure may be maintained at elevated temperature by virtue of convective heat transfer from an elevated temperature carrier gas flowed past the structure, so that the sensible heat of the flowing gas stream is employed to maintain the flash vaporization matrix structure at a desired temperature level.

Alternatively, the matrix structure may be provided with a suitable source of heating energy, such as means for infrared (IR) heating of the structure, e.g., an IR lamp disposed proximate to the first fluid flow passage in the vicinity of an IR-transmissive window in the first fluid flow passage, so that radiant IR energy is transmitted therethrough to heat the matrix structure.

FIG. 9 is a schematic illustration of a vaporization apparatus 300 according to another embodiment of the invention.

The vaporization system 300 may be usefully employed for vaporization, and specifically flash vaporization, of a wide variety of liquid reagents which require delivery in vapor form to a locus of use.

The apparatus comprises a housing 302 which as shown may be of generally elongate cylindrical shape. The housing 302 defines a vaporization chamber with respective upper and lower ends 304 and 306.

The vaporization chamber thus includes an interior volume 308 therewithin which is at least partially bounded by an enclosing interior wall surface 320 of the housing.

The interior wall surface 320 features a series of longitudinally spaced-apart channels or grooves 322, 324, 326 and 328 therein, each of which is substantially perpendicular to the longitudinal axis L—L of the housing and vaporization chamber comprising such housing. Each of the channels or grooves 322, 324, 326, and 328 may be suitably formed by scribing or otherwise forming a concave involution in the wall surface 320. Each of the channels or grooves thus provides a branch liquid flow passage joined in liquid flow communication for, with manifold channel 350. As shown the manifold channel 350 may be substantially parallel in orientation with respect to the longitudinal central axis L—L of the housing and the vaporization chamber. The manifold channel 350 thus serves as a feed trough for liquid which is delivered to the vaporization chamber by means of conduit 352. Conduit 352 has coupling fitting 354 at its outer extremity, for joining to a liquid feed line for supply of liquid source reagent from source vessel 301. The source reagent liquid thus flows in the direction indicated by arrow A into the conduit 352 which is joined in liquid flow communication with manifold channel 350 from which the liquid is distributed to the respective channel branches 322, 324, 326, and 328. In this manner, the liquid is distributed over the contiguous surface 303 of porous vaporization element 340, which may be formed of a sintered metal material, porous ceramic media, or other suitable material of construction. Thus, the vaporization element in this embodiment is disposed in the vaporization chamber and has an outer wall surface 303 in contiguous relationship to the enclosing interior wall surface 320 of the housing. The porous vaporization element 340 has an inner wall surface 305 which is presented to the interior volume 308 of the vaporization chamber.

By this arrangement, liquid fed into the branch channels contacts the outer surface 303 of the porous vaporization element 340, which is heated to a temperature suitable for vaporization of the source reagent liquid (by means not shown in FIG. 9), so that source reagent liquid thereby is vaporized. The resulting vapor transfuses through the porous wall of the vaporization element to the inner surface of the vaporization element, from which it passes into the interior volume 308 for discharge at the lower outlet end 306 of the chamber, in the direction indicated by arrow C, and is transferred to a downstream sub-system of the process system. The downstream locus of use may for example comprise a chemical vapor deposition reactor, in which a substrate is deposited with a material derived from the vapor discharged from the vaporization apparatus.

In some embodiments of the system shown in FIG. 9, it may be desirable to introduce to the interior volume 308 of the vaporization chamber a suitable carrier gas, and for such purpose the upper end 304 of the vaporization chamber is provided with an introduction conduit 360 through which carrier gas can be flowed, in the direction indicated by arrow B, for mixing with the vaporized reagent entering the interior volume 308 through the porous wall member of the vaporization element 340.

It will be recognized that in some applications, it will be desired to discharge from the vaporization chamber only the vaporized reagent, free of any carrier gas or other gas or vapor components mixed therewith, and in such instance, the carrier gas feed conduit 360 may be omitted from the apparatus, or otherwise provided with a suitable valve or other flow restriction means to close the interior volume of the chamber to any carrier gas feed introduction.

It is seen from the schematic depiction in FIG. 9 that the porous vaporization element 340 comprises a porous wall member having an outer wall surface which together with the grooves or channels in the vaporization chamber wall provides a flow channel arrangement which distributes the source reagent liquid over the outer wall surface of the vaporization element. It will be recognized that the flow channel arrangement may be widely varied, and that in some instances, it may be desirable to have a series of grooves or channels parallel to the central axis L—L of the vaporization chamber, which are circumferentially spaced-apart about the periphery of the inner wall surface of the vaporization chamber, and which are interconnected by one or more connecting feed troughs such as channel 326 in the FIG. 9 embodiment.

It may also be possible to knurl or texturize the inner wall surface of the vaporization chamber, in relation to the porous vaporization element in contact therewith, to effect distribution of liquid over the vaporization wall member surface via capillary action, gravitational flow, and/or other hydrodynamic phenomena, whereby the vaporization operation is carried out most efficaciously.

It will likewise be appreciated that the porous wall member 340 may itself be variously formed, e.g., with an undulant or grooved surface which cooperates with channels formed in the wall of the vaporization chamber, to accommodate liquid distribution for vaporization thereof.

It will also be appreciated that the vaporization apparatus could be fabricated with a vaporization chamber wall surface devoid of any channel or passage means therein, and with the porous wall member or other vaporization element constructed so as to form a liquid channel in cooperation with the housing wall in proximity thereto.

It may also be feasible in some instances to space the porous wall member in relation to the vaporization chamber wall surface, such as by means of a collar or spacer element which provides an enclosed liquid distribution volume, so that the liquid can enter such plenum space between the outer surface of the porous wall member and the inner wall surface of the vaporization chamber housing, and be readily vaporized.

FIG. 10 is an enlarged sectional view of apparatus shown in FIG. 9 and described hereinabove.

As shown in FIG. 10, the housing 302 has an enclosing interior wall surface 320 which is in abutting contact with the outer wall surface 303 of porous vaporization element 340, with the channel branches 322, 324, 326 and 328 being more clearly shown as providing passages for distribution of source reagent liquid over the full extent of the porous vaporization element, which by virtue of its porosity and void volume effects a wicking action on the liquid, so that capilliary action distributes the liquid throughout the volume of the vaporization element, so that vaporization is effected at a high flux, with respect to the throughput of generated vapor deriving from the liquid and passing through the vaporization element into the interior volume of the housing 302 for passage to the chemical vapor deposition reactor.

FIG. 10 also shows in greater detail, at the left-hand side of the housing 302 as shown, the manifold channel 350 which is arranged in receiving relationship to liquid feed conduit 352 having coupling 354 at its left-hand extemity in the view shown.

The vaporization apparatus shown in FIGS. 9 and 10 is adapted to accommodate a high flow rate vaporization of source reagent liquid for chemical vapor deposition processing. In an illustrative embodiment, the housing 302 may have an inner diameter on the order of ⅝ inch, and the carrier gas conduit 360 may suitably have an outer diameter of ¼ inch and an inner diameter of ⅛ inch. The outer diameter of the housing 302 is on the order of 0.8 inch. The carrier gas openings 370 in conduit 360 may for example have a diameter on the order of ¼ times the outer circumference of conduit 360. The channel branches 322, 324, 326 and 328 may for example be spaced at 2 inch intervals along the length of the housing 302, in the interior wall surface 320 thereof.

Figure 11:
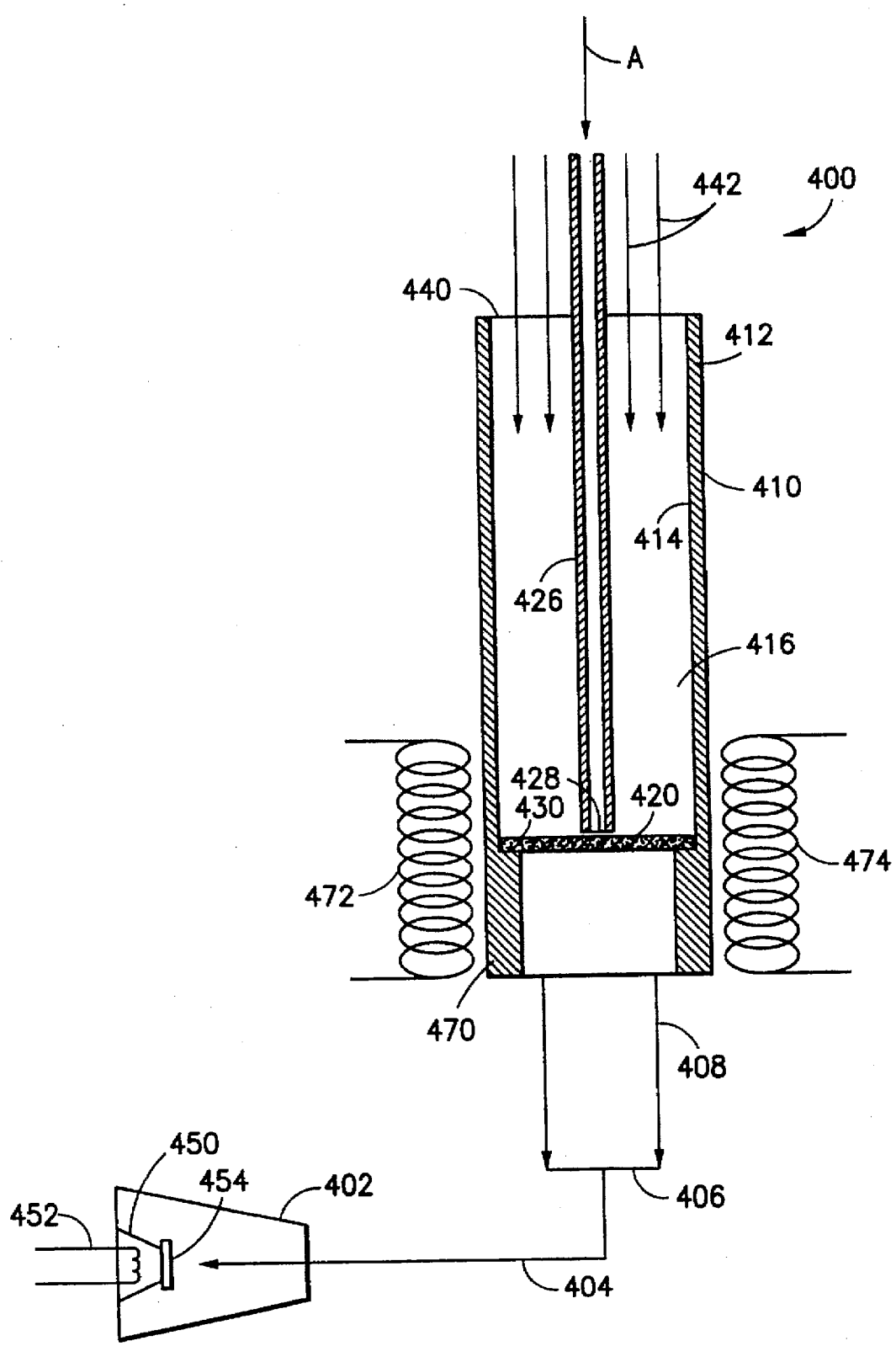
FIG. 11 is a schematic view of a vaporizer system according to another embodiment of the invention.

FIG. 11 is a schematic view of a vaporizer system comprising a vaporizer apparatus 400 which is coupled in source reagent vapor flow communication relationship with a chemical vapor deposition reactor 402, by means of vaporizer discharge line 404, which is connected via manifold 406 to the gas discharge lines 408 from the vaporization apparatus. The vaporization apparatus comprises a housing 410 having an outer wall 412 and an inner wall surface 414 bounding an interior volume 416 of the housing. The housing in this embodiment is cylindrical in shape, therein the interior volume 416 has a circular cross-section in the housing. In the interior volume 416 of the housing 410 is disposed vaporization element 420, the peripheral outer edges of which are in abutting contact with the inner wall surface 414 of the housing wall 410. The housing 410 contains an axially positioned source reagent liquid feed conduit 426 therein, having a lower terminus 428 which is in close, almost touching contact with the top surface 430 of the vaporization element 420. By such arrangement, liquid source reagent from feed conduit 426 is discharged directly onto the perpendicularly facing top surface 430 of the vaporization element, so that the liquid thereby is redirected to the outer periphery of the element, assisted in such movement by capillary forces and wicking action of the element.

The housing 410 at its inlet end 440 receives a flow of carrier gas flowing in the direction indicated by arrows 442 in FIG. 11. The carrier gas in such arrangement passes through the porous vaporization element 420 and is discharged to manifold 406 for flow in source reagent vapor discharge line 404 to CVD reactor 402. The CVD reactor contains a susceptor 450 which is heated as for example by electric or resistance element 452. The susceptor has a substrate article 454 mounted thereon in vapor receiving relationship with respect to the source reagent vapor introduced to the reactor in line 404.

Disposed about the lower portion 470 of the housing 410 are heating coils 472 and 474, which may carry a heated liquid or other suitable heat transfer medium, to effect heating of the wall 410 and thereby the vaporization element 420, so that the vaporization element is heated to a temperature appropriate to effect vaporization of the source reagent liquid which is flowed in a direction indicated by arrow A through feed liquid conduit 426 to the top central surface of the element, for radial outward distribution of the liquid through the porous element to effect volatilization thereof.

Figure 12:
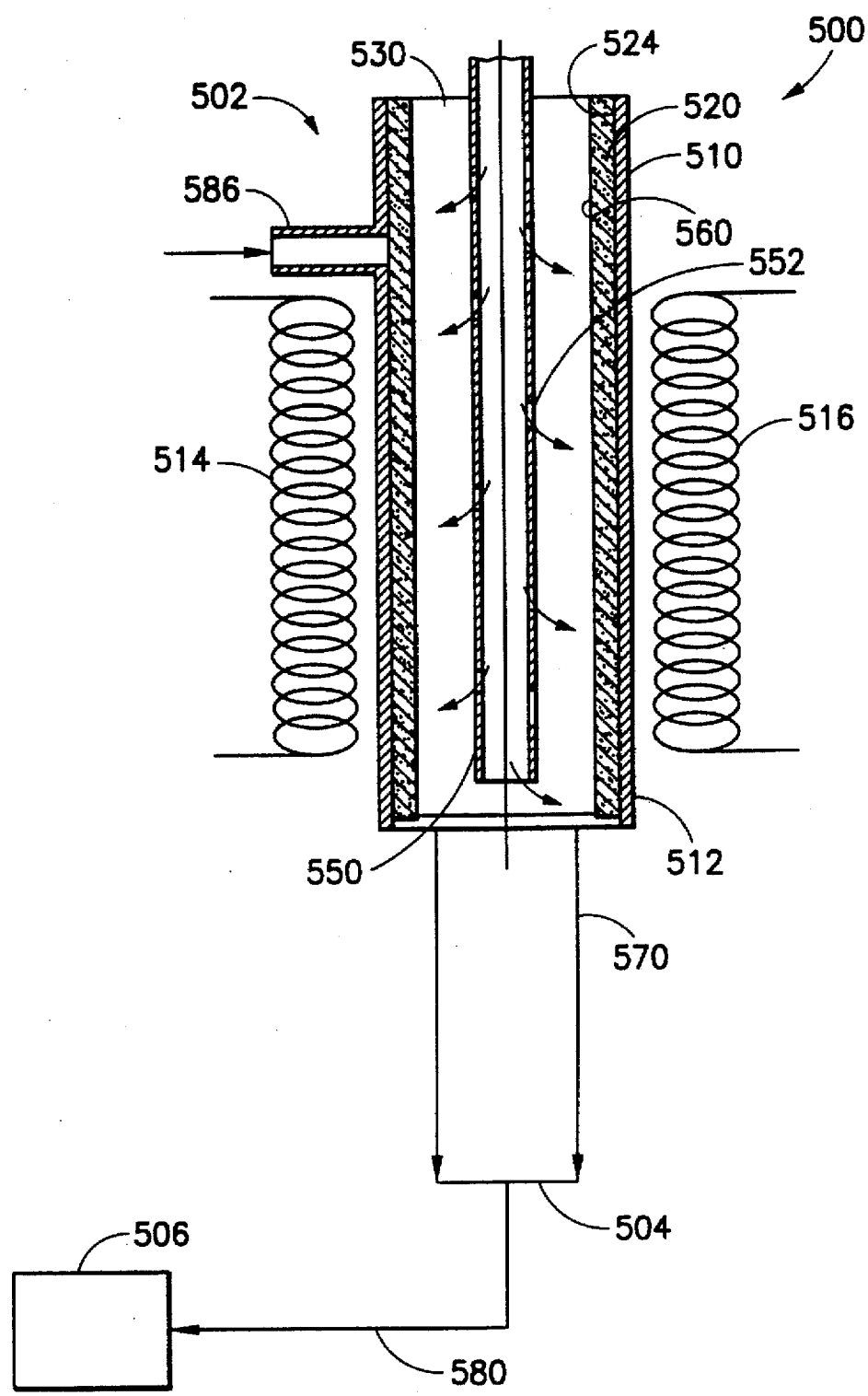
FIG. 12 is a schematic view of a further embodiment of a vaporizer system according to the present invention.

FIG. 12 shows a schematic depiction of a vaporization system 500 comprising vaporizer apparatus 502 joined by means of manifold 504 and source reagent vapor transfer conduit to CVD reactor 506, wherein the volatilized source reagent is contacted with a substrate, so that the decomposing reagent effects deposition on the substrate of a desired metal or other vapor constituent. The vaporizer apparatus 520 shown in FIG. 12 comprises a cylindrical housing 510 having an outer surface 512 which is contacted by heating coils 514 and 516 and conveying a suitable heat transfer fluid therethrough for heating of the wall 510 and thereby the interior sleeve vaporization element 520, the outer surface of which is in contact with the inner wall surface 524 of the wall. The wall may be constructed as shown and described in connection with FIGS. 9 and 10 hereof, whereby liquid flowed through channels in the wall is vaporized and flows through the porous vaporization element into the interior volume 530 bounded by the wall of the tube 510.

A carrier gas flow conduit 550 is concentrically axially disposed in the interior volume 530 of the tube 510. The tube 550 is perforated with openings 552 along its length, whereby carrier gas is disbursed into the interior volume along the interior surface 560 of the vaporization element, to thereby entrain the volatilized source reagent and carry the vapor out of the housing in lines 570 to the manifold 504 and source reagent vapor feed line 580 to the CVD reactor 506.

The source reagent liquid in the FIG. 12 system is introduced in conduit 586 to the channels defined by the wall 510 and vaporization element 520, as more fully described hereinabove with reference to the embodiment shown in FIGS. 9 and 10 hereof.

While the invention has been described with reference to specific aspect, features, and embodiments thereof, it will be apparent that various modifications, variations, and embodiments are possible, and accordingly the invention is to be broadly construed with respect to all such modifications, variations, and embodiments as being within the spirit and scope of the invention.

What is claimed is:

1. A high flux vaporizer apparatus for volatilization of a liquid-phase source reagent to produce source reagent vapor for flow to a chemical vapor deposition reactor coupled in vapor flow relationship to the vaporizer apparatus, said vaporizer apparatus comprising:

a gas flow passage including an interior volume therewithin which is bounded by a wall member having an inner surface, wherein the interior volume of said gas flow passage defines a gas flow path for vapor produced by volatilization of said liquid-phase source reagent;

a porous source reagent liquid vaporization element, having porosity constituted by pores of average pore size diameter in the range of from about 0.5 microns to about 200 microns with said porosity providing a void volume in said vaporization element of from about 10 to about 70 percent void volume, based on the volume of the vaporization element, said vaporization element being positioned in abutting relationship to said inner surface of the gas flow passage wall member and defining therewith a restricted vaporization region for generation of source reagent vapor from said liquid-phase source reagent;

a source reagent liquid feed passage having a terminus defining a source reagent liquid outlet, and arranged to discharge liquid in a direction transverse to a facing surface of the vaporization element so that liquid-phase source reagent liquid is distributed in a film across the area of said surface of the vaporization element through capillary wicking action on said liquid; and a heating means disposed in heating relationship to the wall of the gas flow passage for heating of the vaporization element to a temperature for vaporization of said liquid-phase source reagent.

2. A vaporization apparatus according to claim 1, wherein the vaporization element is of disk shape, and is abuttingly mated at its periphery with said inner wall surface of the gas flow passage wall member.

3. A vaporization apparatus according to claim 2, wherein the vaporization element is mounted substantially perpendicular to a longitudinal axis of the gas flow passage, and with the source reagent liquid feed passage being axially disposed in said gas flow passage, with said discharge end thereof in close proximity to said vaporization element facing surface, with a distance between the terminus of the source reagent liquid feed passage and said facing surface of said vaporization element which is less than 20 mils.

4. A vaporization apparatus according to claim 1, wherein the heating means comprises heating coils in exterior contact with the wall member of the gas flow passage, along a portion of the length of said gas flow passage.

5. A vaporization apparatus according to claim 1, wherein said gas flow passage wall member is cylindrical in shape, and elongate in character.

6. A vaporization apparatus according to claim 1, wherein a carrier gas supply is coupled in carrier gas feed arrangement to the gas flow passage, for flow of carrier gas therethrough, whereby the vaporized source reagent liquid vapor is entrained in said carrier gas and flowed to said chemical vapor deposition reactor.

7. A vaporization apparatus according to claim 1, wherein the average pore size of porosity in the vaporization element if from about 1 to about 100 microns average pore size diameter.

8. A vaporization apparatus according to claim 1, wherein the gas flow passage is of cylindrical form having a cross-sectional area bounded by said inner surface of said wall of the gas flow passage, and which is between about 10 and about 50 times the cross-sectional area of the source reagent liquid feed conduit.

9. A vaporization apparatus according to claim 1, wherein the void volume of the vaporization element is from about 15 percent to about 65 percent void volume, based on the volume of the vaporization element.

10. A high flux vaporization apparatus for volatilization of a liquid-phase source reagent to produce source reagent vapor for flow to a chemical vapor deposition reactor coupled in vapor flow relationship to the vaporization apparatus, said vaporization apparatus comprising:

a gas flow passage including an interior volume therewithin which is bounded by a wall member having an inner surface, wherein the interior volume of said gas flow passage defines a gas flow path for vapor produced by volatilization of said liquid-phase source reagent;

a porous source reagent liquid vaporization element, having porosity constituted by pores of average pore size diameter in the range of from about 0.5 microns to about 200 microns with said porosity providing a void volume in said vaporization element of from about 10 to about 70 percent void volume, based on the volume of the vaporization element, said vaporization element being positioned in abutting relationship to said inner surface of the gas flow passage wall member and defining therewith a restricted vaporization region for generation of source reagent vapor from said liquid-phase source reagent;

a source reagent liquid feed passage having a terminus defining a source reagent liquid outlet; and arranged to discharge liquid in a direction transverse to a facing surface of the vaporization element so that liquid-phase source reagent liquid is distributed in a film across the area of said surface of the vaporization element through capillary wicking action on said liquid; and a heating means disposed in heating relationship to the wall of the gas flow passage for heating of the vaporization element to a temperature for vaporization of said liquid-phase source reagent, wherein the vaporization element is of cylindrical shape with an outer diameter less than but proximate to the inner diameter of said gas flow passage, and wherein the vaporization element is disposed in said gas flow passage with an exterior surface of the vaporization element in abutting contact with the inner wall surface of the gas flow passage wall, and wherein the portion of the inner wall surface of the gas flow passage in contact with the vaporization element is channelized with a series of longitudinally spaced-apart, circumscribing transverse channels, interconnected in liquid flow relationship with a manifold channel extending longitudinally of said portion of the inner surface of the gas flow passage wall, with the manifold liquid flow channel being in liquid receiving relationship to the source reagent liquid feed passage, whereby liquid is introduced to the manifold channel and flowed into the circumscribing transverse channels in contact with the vaporization element, so that source reagent liquid is vaporizable by the vaporization element to form vapor flowable through the porous vaporization element to the interior volume of the gas flow passage for flow therethrough to said chemical vapor deposition reactor.

11. A vaporization apparatus according to claim 10, wherein the heating means comprises heating coils in exterior contact with the wall member of the gas flow passage, along a portion of the length of said gas flow passage.

12. A vaporization apparatus according to claim 10, wherein said gas flow passage wall member is cylindrical in shape, and elongate in character.

13. A vaporization apparatus according to claim 10, wherein a carrier gas supply is coupled in carrier gas feed arrangement to the gas flow passage, for flow of carrier gas therethrough, whereby the vaporized source reagent liquid vapor is entrained in said carrier gas and flowed to said chemical vapor deposition reactor.

14. A vaporization apparatus according to claim 10, wherein the average pore size of porosity in the vaporization element is from about 1 to about 100 microns average pore size diameter.

15. A vaporization apparatus according to claim 10, wherein the gas flow passage is of cylindrical form having a cross-sectional area bounded by said inner surface of said wall of the gas flow passage, and which is between about 10 and about 50 times the cross-sectional area of the source reagent liquid feed conduit.

16. A vaporization apparatus according to claim 10, wherein the void volume of the vaporization element is from about 15 percent to about 65 percent void volume, based on the volume of the vaporization element.

17. A vaporization apparatus according to claim 10, wherein the vaporization element comprises a sintered metal material.

18. A vaporization apparatus according to claim 10, wherein said inner surface of said wall of the gas flow passage is texturized along a portion of the length of said gas flow passage.

19. A vaporization apparatus according to claim 10, wherein a portion of the exterior surface of the vaporization element is channelized to accommodate distribution for vaporization thereof.

20. A vaporization apparatus according to claim 10, wherein the vaporization element comprises a ceramic media.

* * * * *

UNITED STATES PATENT AND TRADEMARK OFFICE
CERTIFICATE OF CORRECTION

PATENT NO. : 5,711,816
DATED : January 27, 1998
INVENTOR(S) : Kirlin et al.

It is certified that error appears in the above-indentified patent and that said Letters Patent is hereby corrected as shown below:

```
Title page, under Related Application Data Section, 2nd line     change
               "Jul. 28, 1994" to -- Jul. 25, 1994 --.
    Column 7, Line 48      change "robe" to -- tube --.
    Column 13, Line 40     change "flit" to -- frit --.
    Column 20, Line 29     change "clement" to -- element --.
```

Signed and Sealed this

Twenty-sixth Day of May, 1998

Attest:

BRUCE LEHMAN

*Attesting Officer*   *Commissioner of Patents and Trademarks*